United States Patent
Holthaus

(10) Patent No.: US 10,601,357 B2
(45) Date of Patent: Mar. 24, 2020

(54) METHOD FOR EMULATING A THREE-PHASE ELECTRIC MOTOR USING A LOAD EMULATOR, AND A CORRESPONDING LOAD EMULATOR

(71) Applicant: dSPACE digital signal processing and control engineering GmbH, Paderborn (DE)

(72) Inventor: Nils Holthaus, Schlangen (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 337 days.

(21) Appl. No.: 15/782,148

(22) Filed: Oct. 12, 2017

(65) Prior Publication Data
US 2018/0123497 A1 May 3, 2018

(30) Foreign Application Priority Data
Oct. 27, 2016 (EP) .................................... 16195987

(51) Int. Cl.
*H02P 7/06* (2006.01)
*H02P 27/08* (2006.01)
(Continued)

(52) U.S. Cl.
CPC ............. *H02P 27/08* (2013.01); *G01R 31/42* (2013.01); *G05B 17/02* (2013.01); *H02P 7/06* (2013.01); *H02P 27/06* (2013.01)

(58) Field of Classification Search
None
See application file for complete search history.

(56) References Cited

U.S. PATENT DOCUMENTS

| 4,932,252 A | * | 6/1990 | Bovenlander | ........... G01L 5/282 73/123 |
| 8,996,917 B1 | * | 3/2015 | Chandramohan | ... G06F 11/3696 714/26 |

(Continued)

FOREIGN PATENT DOCUMENTS

| DE | 10 2012 111 051 A1 | 5/2014 |
| EP | 2 940 857 A1 | 11/2015 |
| JP | 2008118797 | 5/2008 |

OTHER PUBLICATIONS

European Search Report for European Application No. 16195987.9 dated Apr. 2, 2017, with English translation.
(Continued)

*Primary Examiner* — Kibrom K Gebresilassie
(74) *Attorney, Agent, or Firm* — Muncy, Geissler, Olds & Lowe, P.C.

(57) ABSTRACT

A method for emulating a three-phase electric motor using a load emulator, wherein the load emulator is connected in a three-phase manner via its load terminals to the supply terminals of a motor controller. The load emulator has emulator power electronics and an emulator controller for controlling the emulator power electronics. The emulator controller determines the supply terminals that are driven by the motor controller and the supply terminals that are not driven. The emulator power electronics are driven by the emulator controller in such a manner that phase currents calculated by the emulator controller on the basis of a motor model flow in the supply terminals that are driven by the motor controller. A phase voltage calculated by the emulator controller on the basis of a motor model is applied to the supply terminal that is not driven by the motor controller.

15 Claims, 7 Drawing Sheets

(51) Int. Cl.
*G05B 17/02* (2006.01)
*G01R 31/42* (2006.01)
*H02P 27/06* (2006.01)

(56) References Cited

U.S. PATENT DOCUMENTS

| | | | |
|---|---|---|---|
| 2008/0116943 A1* | 5/2008 | Nair | H03K 19/018528 |
| | | | 327/108 |
| 2016/0098025 A1* | 4/2016 | Mansouri | G05B 17/02 |
| | | | 700/29 |
| 2017/0047880 A1* | 2/2017 | Holthaus | G05B 17/02 |
| 2017/0220526 A1* | 8/2017 | Buchanan | G06F 7/5443 |

OTHER PUBLICATIONS

Oettmeier M et al., "Power-electronic-based machine emulator for high-power high-frequency drive converter test", Vehicle Power and Propulsion Conference 9VPPC), 2010 IEEE, IEEE, pp. 1-6, XP031929124, DOI: 10.1109/VPPC.2010.5728988, ISBN: 978-1-4244-8220-7 (Sep. 1, 2010).

* cited by examiner

METHOD FOR EMULATING A THREE-PHASE ELECTRIC MOTOR USING A LOAD EMULATOR, AND A CORRESPONDING LOAD EMULATOR

This nonprovisional application claims priority under 35 U.S.C. § 119(a) to European Patent Application No. 16195987.9, which was filed in Europe on Oct. 27, 2016, and which is herein incorporated by reference.

BACKGROUND OF THE INVENTION

Field of the Invention

The invention relates to a method for emulating a three-phase electric motor using a load emulator, wherein the load emulator is connected in a three-phase manner via its load terminals to the supply terminals of a motor controller, and the load emulator has emulator power electronics and an emulator controller for controlling the emulator power electronics, wherein the emulator controller determines the supply terminals that are driven by the motor controller and the supply terminals that are not driven, and the emulator power electronics are driven by the emulator controller in such a manner that phase currents $i_{emulate}$ calculated by the emulator controller on the basis of a motor model flow in the supply terminals that are driven by the motor controller, and a phase voltage $v_{emulate}$ calculated by the emulator controller on the basis of a motor model is applied to the supply terminal that is not driven by the motor controller. Moreover, the invention also relates to the emulator controller of a load emulator that is designed such that it can carry out the above-described method for emulating a three-phase electric motor in conjunction with emulator power electronics.

Description of the Background Art

Methods for emulating electrical loads with the aid of load emulators are used for testing motor controllers under laboratory conditions without the need to connect a "real" electric drive—here in the form of a three-phase electric motor—to the controllers. The electrical load, which is to say the three-phase electric motor, is instead emulated by the load emulator. The motor controller frequently has a control unit with a power output stage in the form of a converter. The control unit generates converter control data that are used to appropriately drive the power switches of the converter, which typically are implemented by means of semiconductor switching elements (IGBT, IGCT, etc.). In the application case under consideration here, the converter of the motor controller operates as an inverter, which is to say it has a DC voltage source as the energy source and drives a load with AC voltage. The converter of the motor controller usually includes a half-bridge circuit implemented with the said power switches, wherein the power switches are provided with freewheel diodes connected in antiparallel, through which currents driven through the inductances of the motor can decay when the power switch is open.

The load emulator is oftentimes implemented in the form of a hardware-in-the-loop simulator, which is to say by a simulation computer that calculates mathematical models of the environment to be simulated—here, the load in the form of the three-phase electric motor—using numerical methods and that for its part has a power electronic output stage—the emulator power electronics—that can be connected through the load terminals of the load emulator to the corresponding supply terminals of the motor controller. The method for emulating a three-phase electric motor implemented on the load emulator ultimately ensures that the motor controller is electrically loaded through its supply terminals as if it were connected to the real drive.

A previously disclosed method for emulating a three-phase electric motor is known, for example, from EP 2940857 A1, which corresponds to US 2017/0047880, which is incorporated herein by reference. Here, the three-phase electric motor is exclusively a brushless DC motor. Reference is made to the disclosure of this application because of the similarity of its content. Brushless DC motors are low-wear and low-maintenance because of the brushless construction.

In brushless DC motors driven in block commutation mode, two of the three motor phases are always driven by the motor controller—two of the three supply terminals of the motor controllers are then driven—and the third phase of the three-phase winding is not driven by the motor controller, and the corresponding supply terminal of the motor controller is then likewise not driven. A rotating magnetic field is created through periodic switching of the three-phase windings by the motor controller. In the phase of the brushless DC motor that is not driven by the motor controller, the phase current drops, and soon vanishes completely. The phase of the brushless DC motor that is not driven also is often referred to as the currentless phase, wherein—as explained above—states of not being driven and of being currentless can be separated in time. If a phase of the brushless DC motor is no longer driven by the motor controller, the consequence is that the phase current in the phase that is no longer driven ultimately vanishes, but not necessarily immediately after commutation, and the phase is then in fact currentless.

In the phase of the brushless DC motor that is not driven, however, a back EMF is induced, the sensing of which is of major importance for driving the brushless DC motor, since the angular position of the rotor can be determined therefrom, and hence the motor controller can determine the time of the next commutation, which is to say the time of the switch from non-driven supply terminals to driven supply terminals and vice versa, even without a separate rotary position sensor. For this reason, the emulation of the back EMF induced in the non-driven phase is essential in emulating block-commutated brushless DC motors so that the motor controller can determine the time of the next commutation even without a rotary position sensor. However, calculation of the back EMF as part of emulation is important even in the case of brushless DC motors equipped with a rotary position sensor, since only in this way can the physical relationships of the emulated motor, and thus the connected loads, be correctly calculated and emulated.

In order to apply appropriate connected electrical loads to the supply terminals of the motor controller, the emulator power electronics include voltage sources and current sources, which generally can be connected to the load terminals of the emulator power electronics through decoupling inductances. Thus, by suitably connecting the voltage sources and current sources to the load terminals of the emulator power electronics it is possible to react to whether a load terminal only has an induced back EMF connected to it in the state in which it is not driven by the motor controller, or whether a load terminal carries a current in the state in which it is driven by the motor controller. The decoupling inductances provided between the load terminals and the voltage and current sources prevent the connected electrical loads defined by the switched voltage and current sources from exerting an undelayed effect on the load terminals.

The above described document EP 2940857 A1 describes a method that permits high-quality emulation of a three-phase brushless DC motor using a load emulator in that the time of commutation is detected reliably even under changing operating conditions. This relates to normal operation of the three-phase DC motor.

Thus, it is possible to emulate the motor operation of three-phase DC motors and to detect and react appropriately to the change in driving of the different phases of the DC motor by the motor controller.

There is great interest in expanding methods known in the conventional art such that practically any three-phase electric motor can be emulated with a load emulator, which is to say, for example, permanently excited synchronous machines or even asynchronous motors with sine-commutated or comparable drive. The essential difference between sine-commutated drive and block-commutated drive is that in a sine-commutated drive, all motor phases are driven without interruption, which is to say that none of the motor phases are non-driven, and hence currentless, during operation. Defined voltages are continuously output by the power electronics of the motor controller to the supply terminals of the motor controller.

With the methods known from the conventional art for emulating a three-phase electric motor using a load emulator, moreover, it is not possible, or is only possible with severe limitations, to respond appropriately to special situations in the operation of an electric motor. Special situations of this nature relate, for example, to the handling of initialization routines of the motor controller, whose tasks include testing the connection of the electric motor to the control unit and fundamental characteristics of the electric motor (e.g., the presence of a short or open circuit), for example in that the output stage of the motor controller applies an arbitrary voltage to one motor phase and measures in return on the other phases. Other such routines are used for motor diagnostics, for example.

SUMMARY OF THE INVENTION

It is therefore an object of the present invention to further develop a method for emulating a three-phase electric motor using a load emulator such that it is not limited to the operation of brushless three-phase DC motors, and also takes into account special operating situations of a three-phase electric motor that lie outside normal operation as a motor or as a generator.

In an exemplary embodiment, the object is attained in a method for emulating a three-phase electric motor by the means that the load emulator includes a switch with which the emulator power electronics can be disconnected with high resistance from the supply terminals and with which the emulator power electronics can be connected with low resistance to the supply terminals, and wherein the supply terminals are connected to one another through a high-resistance resistor network. Furthermore, in order to simulate selected operating states of the electric motor, the emulator power electronics are disconnected with high resistance from the supply terminals using the switch or the emulator power electronics that have already been disconnected with high resistance from the supply terminals are connected with low resistance to the supply terminals using the switch.

In order to carry out the method according to the invention, the load emulator is augmented in terms of circuitry by a switch and by a high-resistance resistor network. The switch allows the emulator power electronics to be disconnected with high resistance from the supply terminals and of course also the reverse, for the emulator power electronics to be reconnected with low resistance to the supply terminals. As a result of this measure, it is fundamentally possible, first of all, to electrically isolate the emulator power electronics from the motor controller efficaciously. This "isolation" can be realized through a variety of circuits. It is not necessary for complete galvanic decoupling to be present, but also is sufficient if a very high-resistance electrical disconnection of the emulator power electronics from the supply terminals is possible, for example through semiconductor switches, which do not represent perfect galvanic isolation. The switch provided thus make it possible to suppress interaction between the motor controller and the emulator power electronics, which is advantageous in some situations, as will be demonstrated below.

In addition, the supply terminals are connected to one another through a high-resistance resistor network. This connection of the supply terminals through the high-resistance resistor network is not influenced by the switch in this context; in other words the high-resistance resistor network is still connected to the supply terminals when the emulator power electronics are disconnected with high resistance from the supply terminals using the switch. The high-resistance connection of the supply terminals through the resistor network is chosen precisely so that, in normal operation of the load emulator, which is to say when there is a functioning low-resistance connection between the emulator power electronics and the supply terminals, the resistor network loads the motor controller only negligibly. The purpose of the resistor network is that the supply terminals of the motor controller, which are of course connected to the load terminals of the load emulator, are still connected even when the emulator power electronics have been disconnected with high resistance from the load terminals or from the supply terminals using the switch. The supply terminals of the motor controller are not electrically open then, but instead are connected to one another through the high-resistance resistor network.

This creates the prerequisite in terms of circuitry for the ability to react fundamentally to specific operating modes of the motor controller, even when the emulator power electronics are disconnected with high resistance from the motor controller. This is desirable when, for example, the motor controller applies a voltage to the supply terminals in an initialization phase or applies a voltage pattern to different supply terminals and attempts to measure a voltage back through the other supply terminals in order to thus obtain information about the motor that is apparently connected. In this case such feedback through the high-resistance resistor network is easily possible. The high-resistance resistor network thus represents the connected motor for the motor controller, even when the emulator power electronics have been disconnected from the supply terminals with high resistance.

In order to handle the selected operating state of initialization of the motor controller and of the electric motor, therefore, the emulator power electronics are disconnected with high resistance from the supply terminals using the switch. Conversely, it can be advantageous in the selected operating state of startup of the electric motor to initially disconnect the emulator power electronics from the supply terminals using the switch and to observe the signal pattern output from the motor controller at the supply terminals in order to subsequently reconnect the emulator power electronics with low resistance to the supply terminals after an appropriate adjustment and synchronization of the load emulator, so that a switchover from the high-resistance disconnected state to the low-resistance connected state takes place here as a result.

The method for emulating a three-phase electric motor using a load emulator can be designed such that a star connection of three essentially ohmic resistors is chosen as the high-resistance resistor network, wherein each of the free ends of the star connection is connected to a different supply terminal of the motor controller. The symmetrical star connection simulates the phases of the three-phase electric motor under simulation, which as a general rule are likewise symmetrical in design. The neutral point is free in terms of potential, which is to say that the potential established here is the one that results from the corresponding driving of voltages at the free ends of the star connection by the supply terminals of the motor controller; in any case, this is the determining influence when the emulator power electronics are disconnected with high resistance from the supply terminals.

In an embodiment of the method, provision is made that, as an initial state, the motor controller drives no supply terminal and the emulator power electronics are disconnected with high resistance from the load terminals using the switch, and that motor startup as a motor is detected by a commencing driving of the supply terminals by the motor controller when at least one of the output difference voltages $v_{inv,diff}(i,j)$ determined by measurement between the supply terminals i, j of the motor controller is greater than a predetermined voltage threshold $TH_{impedance}$.

This is an example of a state change out of the high-resistance state in that the voltages from the supply terminals that are measured in return, and thus also the output difference voltages that can be determined or measured directly, are taken into account. The motor here is driven as a motor from a standstill, so voltages for supplying current to the three-phase electric motor are output by the power output stage of the motor controller through the supply terminals. These output voltages $v_{inv}$ are then pulled either to the DC link voltage $v_{DC\_Link}$ or to the ground potential. So as not to switch immediately out of the high-resistance state for arbitrarily small output difference voltages $v_{inv,diff}$, a specific voltage threshold $TH_{impedance}$ is specified.

Conversely, it is also possible to detect the generator case, which is to say the case when the emulated three-phase electric motor is driven by a load. In this case, provision is made that, as an initial state, the motor controller drives no supply terminal and the emulator power electronics are disconnected with high resistance from the load terminals using the switch, and that motor startup as a generator is detected when the motor speed of the motor model is evaluated and the motor speed is not equal to zero.

In this case, all half-bridge switches of the motor controller are open. When the three-phase electric motor is driven at a specific speed, an electrical back EMF is induced in the stator windings. As long as all induced back EMFs measurable between two motor phases are smaller than the DC link voltages present at the supply terminals of the motor controller, no current flows through the stator windings, so that the induced back EMFs can be measured between any two phases of the motor controller. This state is also present even when the non-driven motor is coasting, which is to say the motor is not externally subjected to a torque, but instead a previously existing speed is slowly diminishing due to the moment of inertia of the rotating parts. The simulated speed is evaluated as a condition for the transition from the high-resistance disconnected state to the driven state in which the emulator power electronics are again connected with low resistance to the load terminals; an actual speed is of course not present since the three-phase electric motor is only emulated in the emulator controller. As soon as the emulated electric motor turns, all phases are changed to the driven state, for example in that a voltage is applied to the load terminals (voltage mode).

In an embodiment, in which a change is made from the high-resistance disconnected state, once in the motor case and once in the generator case, provision can be made that when a motor startup as a motor or as a generator is detected, the emulator power electronics are connected with low resistance to the supply terminals using the switch and the emulator controller drives the load terminals of the emulator power electronics such that a voltage is applied to the supply terminals. It was explained at the outset that the emulator power electronics have voltage sources and current sources in order to apply appropriate connected electrical loads to the supply terminals of the motor controller. In this case, use is made of the voltage sources, which apply a specific voltage to the supply terminals—as a general rule, this will take place through the load terminals of the emulator power electronics—, after a low-resistance connection has again been established between the emulator power electronics and the supply terminals.

In an embodiment of the above-mentioned method, provision can be additionally made that the emulator controller drives the load terminals of the emulator power electronics such that a test voltage is supplied to the supply terminals that cannot be applied to the supply terminals by the motor controller, in particular wherein the test voltage corresponds to half the DC link voltage $v_{DC\_Link}$ of the motor controller. This measure makes it possible to discover which of the supply terminals are driven by the motor controller, whether all supply terminals are driven continuously (as in the case of sine commutation), or only two of the three supply terminals are driven in alternation (as in the case of block commutation).

If all phases are in voltage mode, then provision is made in an embodiment of the method that the test voltage ($v_{DC\_Link}/2$) plus the simulated induced back EMFs in the corresponding motor phase is used in each case as the nominal voltage. Then the test voltage is merely an offset for the emulated induced phase voltages. In the case of a stationary motor as the initial state, the induced back EMFs are equal to zero. However, if the motor is operated as a generator with open bridge switches, or if the motor is coasting with open bridge switches, then an induced back EMF exists that is then likewise taken into account with the nominal value. In this operation (open bridge switches, no current flow, but induced voltages between any two motor phases) the measurable induced voltages do not relate to a potential (e.g., ground), since no current flows to/from the supply terminals, and the motor windings are likewise potential-free (neutral point is potential-free). For this reason, it makes sense on the control unit side to measure the emulated voltage between two arbitrary motor phases, and consequently the specific offset to the corresponding imposition of voltage is ultimately unimportant as long as the measured voltage between any two phases does not become larger than $V_{DC\_Link}$ plus twice the diode voltage.

The choice of a test voltage that cannot be generated by the motor controller is used to make it possible to distinguish the voltage potentials that are measured in return. The motor controller can only switch the DC link voltage or the ground potential onto the supply terminals by means of the semiconductor switches operating within it, which is to say that half the DC link voltage cannot originate from the motor controller; when this voltage is measured on a phase, it is thus a phase not driven by the motor controller that is isolated in terms of potential through open half-bridge switches.

Provision can be made that the application of the test voltage to the supply terminals takes place over a latency time $t_3$, and that the driven state $S_{PH}(j)=0$ of a supply terminal j is detected when the magnitude of the difference voltage $v_{diff}(j)$ between the output voltage $v_{inv}(j)$ measured at the supply terminal j of the motor controller and the test voltage applied through the load terminals is greater after the latency time $t_3$ than a predetermined voltage threshold $v_{TH}$. This measure serves to allow transient processes in the load emulator, in particular in the emulator power electronics, to decay so that a stable and reliable value is obtained in the evaluation of the voltages. The latency time $t_3$ can be designed to be at least as long as the emulator power electronics require in order to reliably set the specified test voltage.

The above-described detection of the driven phases or driven supply terminals, and thus the identification by the motor controller of a block-commutated or a sine-commutated drive, has the result that the three-phase electric motor can be emulated with high reliability and in a correct manner using the load emulator. This is accomplished by the means that, after detecting the driven state $S_{PH}(j)=0$ of the supply terminal j of the motor controller, the emulator controller drives the emulator power electronics such that the phase current $i_{emulate}(j)$ calculated by the emulator controller flows through the supply terminal j that is now driven by the motor controller, in particular wherein upon detection of two simultaneously driven supply terminals the model of a block-commutated motor is used as the motor model, and wherein upon detection of three simultaneously driven supply terminals the model of a sine-commutated motor is used as the motor model. It is not important in this context whether two different models of the electric motor are involved here, it is equally possible for one model to be present that includes the appropriate sub-models for correct handling of the relevant situation.

The method disclosed here for emulating a three-phase electric motor is explicitly not limited to block-commutated electric motors, but instead, it should also be possible to emulate electric motors in which all phases are continuously driven, in other words are supplied with a calculated current by the emulator power electronics. An improvement of the method thus provides that, for an arbitrary phase of the motor and thereby for an arbitrary supply terminal of the motor controller, it is reliably detected whether the phase or supply terminal continues to be driven by the motor controller or not. This question arises at every zero-crossing of the current in a phase. In the case of sine-commutated drive, every phase remains in the driven state, even at a zero-crossing of the current, whereas in the case of block commutation, in contrast, one of the previously driven phases always switches to the non-driven state at a zero-crossing of the current.

Provision is now made that the emulator controller detects the transition of a supply terminal k of the motor controller from the driven state $S_{PH}(k)=0$ to the non-driven state $S_{PH}(k)=1$ by the means that, in a time interval $TI_{Vcalc, 1}$ in which the phase current $i_{emulate}(k)$ calculated by the emulator controller decreases from a predetermined first current value $i_{emulate, 1}(k)$ to a predetermined second current value $i_{emulate,2}(k)$, the time integral $V_{integral, 1}$ over the corresponding measured output voltage $v_{inv}(k)$ of the supply terminal k of the motor controller is calculated. If the time integral $V_{Integral, 1}$ is greater than a predetermined voltage-time threshold $V_{DiodeTH, 1}(k)$, then the phase under consideration is switched to the non-driven state. This then has the consequence that the phase identified as non-driven, or the corresponding load terminal of the emulator power electronics, is switched from the current mode into the voltage mode, which is to say is no longer supplied with a calculated current, but instead with a calculated induced voltage, since the phase is isolated on the part of the motor controller, or in other words is floating.

The idea resides in making use of the circumstance that a current initially still flows through a non-driven supply terminal even in the non-driven state, although this current decays through freewheel diodes of the motor controller converter that are always included in the motor controller. In this process, a voltage, typically approximately 0.7 V, drops across the freewheel diodes. This voltage can be measured through the supply terminals of the motor controller, which is the case at present. In the case of a driven phase or in the case of a driven supply terminal of the motor controller with a zero crossing of the current, the measurable voltage at the relevant supply terminal of the motor controller would either be practically zero or would correspond to $v_{DC\_Link}$. This difference is evaluated using the above-described method.

An improvement of the method that builds on this is distinguished in that the predetermined first current value $i_{emulate, 1}(k)$ is less than half the maximum calculated current value of the phase current $i_{emulate, }(k)$, in particular is less than a quarter of the maximum calculated current value of the phase current $i_{emulate, }(k)$. This ensures that the current is actually approaching a zero crossing. For example, in a 100 A system, $i_{emulate,}(k)$ should be less than 25 A. In practice, a useful threshold value for 100 A systems could even be chosen between 1A and 2A. For applications in the low power range (for example, hard disk motors) this threshold value can even be significantly lower. The important thing is that the voltage across the freewheel diodes is still clearly measurable in the defined current range before the current has completely decayed.

Furthermore, provision can be made that the predetermined second current value $i_{emulate, 2}(k)$ is a fraction of the predetermined first current value $i_{emulate, 1}(k)$, can be three-quarters of the predetermined first current value $i_{emulate, 1}(k)$. The predetermined second current value $i_{emulate, 2}(k)$ should in any case be chosen large enough that the voltage across the freewheel diodes cannot completely collapse.

It has additionally proven useful that the predetermined voltage-time threshold $V_{DiodeTH, 1}(k)$ is the time integral of half the freewheel diode voltage of a freewheel diode included in the motor controller. The time interval $TI_{Vcalc, 1}$ in which the phase current $i_{emulate}(k)$ calculated by the emulator controller decreases from the predetermined first current value $i_{emulate, 1}(k)$ to the predetermined second current value $i_{emulate, 2}(k)$ is also used as the integration time here. The threshold value thus produced is sufficiently large to differ from an integrated voltage of this nature that may still be present at the driven supply terminal if the supply terminal is pulled to the zero potential or to the high potential by a power switch of the converter of the motor controller.

The reliable detection of non-driven supply terminals makes possible an interesting embodiment of the method with which it is possible to respond to, e.g., a motor controller that is switched off. In this embodiment of the method, the emulator controller analyzes the transition of all supply terminals of the motor controller from the driven state $S_{PH}(k)=0$ to the non-driven state $S_{PH}(k)=1$, as previously described. Upon detection of the transition of at least two supply terminals of the motor controller from the driven state $S_{PH}(k)=0$ to the non-driven state $S_{PH}(k)=1$, the emulator power electronics are disconnected with high resistance from the supply terminals using the switch. Then the supply terminals of the motor controller only remain connected to one another with the high-resistance resistor network. It is then still possible to have diagnostic and initialization routines carried out by the motor controller. Of course, this also includes the case in which all three supply terminals of the motor controller switch to the non-driven state $S_{PH}(k)=1$, in which case the motor is coasting. All phases are then in voltage mode, since the induced voltage must be emulated. When the motor speed becomes zero after coasting of the motor, the emulator power electronics are disconnected with high resistance from the supply terminals using the switch.

The object derived and described above is attained correspondingly in the load emulator on which the invention is based by the means that the load emulator can be connected in a three-phase manner through its load terminals to the supply terminals of a motor controller, and the load emulator has emulator power electronics and an emulator controller for controlling the emulator power electronics, wherein the emulator controller determines the supply terminals that are driven by the motor controller and the supply terminals that are not driven, and the emulator power electronics are driven by the emulator controller in such a manner that phase currents $i_{emulate}$ calculated by the emulator controller on the basis of a motor model flow in the supply terminals that are driven by the motor controller, and a phase voltage $v_{emulate}$ calculated by the emulator controller on the basis of a motor model is applied to the supply terminal that is not driven by the motor controller, and that the load emulator includes a switch with which the emulator power electronics can be disconnected with high resistance from the supply terminals and with which the emulator power electronics can be connected with low resistance to the supply terminals and wherein the supply terminals are connected to one another through a high-resistance resistor network.

The load emulator can be distinguished in accordance with the method described above in that, in order to simulate selected operating states of the electric motor, the emulator controller drives the emulator power electronics and the switch such that the emulator power electronics are disconnected with high resistance from the supply terminals using the switch, or the emulator power electronics that have already been disconnected with high resistance from the supply terminals are connected with low resistance to the supply terminals using the switch.

The high-resistance resistor network can be a star connection of three essentially ohmic resistors, wherein each of the free ends of the star connection is connected to a different supply terminal of the motor controller.

Finally, the emulator controller can be designed such that, when it is used as intended, it carries out the above-described method for emulating a three-phase electric motor with the load emulator.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
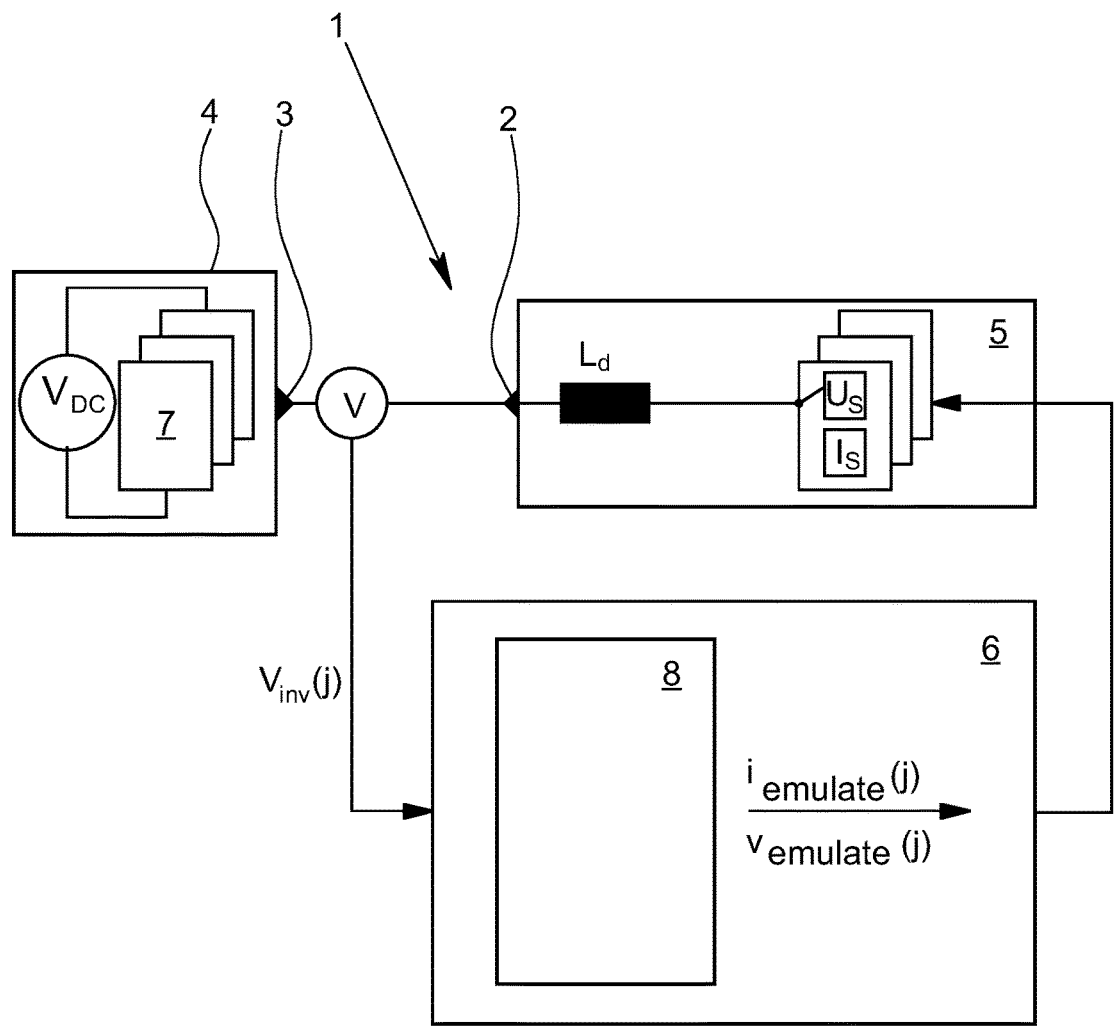
FIG. 1 is an arrangement known from the prior art, composed of motor controller and load emulator for carrying out an embodiment of the method for emulating a three-phase electric motor.

Shown in FIG. 1 is an arrangement that is known per se from the prior art for carrying out a method for emulating a three-phase electric motor, whereby in the prior art this is restricted to a brushless DC motor. The arrangement has, first of all, a load emulator 1, wherein the load emulator 1 is connected in a three-phase manner via its load terminals 2 to the supply terminals 3 of a motor controller 4. The load emulator 1 has emulator power electronics 5 and an emulator controller 6 for controlling the emulator power electronics 5. In the present case, the motor controller 4 also includes power electronics in the form of an inverter 7, indicated as three-phase, that is supplied with power through a DC voltage source $V_{DC}$ and that drives a three-phase AC load through its supply terminals 3 by appropriate switching of the semiconductor switches included in the inverter 7.

The method provides for the emulator controller 6 to determine the supply terminals 3 that are driven by the motor controller 4 and the supply terminals 3 that are not driven, wherein the emulator power electronics 5 are driven by the emulator controller 6 in such a manner that phase currents $i_{emulate}$ calculated by the emulator controller 6 on the basis of a motor model 8 flow in the supply terminals 3 that are driven by the motor controller 4, and a phase voltage $v_{emulate}$ calculated by the emulator controller 6 on the basis of the motor model 8 is applied to the supply terminal 3 that is not driven by the motor controller 4. It can be seen that, in order to accomplish this task, the emulator power electronics 5 have current sources $I_s$ as well as voltage sources $U_S$ that can be switched appropriately onto the load terminals 2 of the emulator power electronics 5, wherein this takes place indirectly for each phase through a decoupling inductance $L_d$ in the present case.

Figure 2:
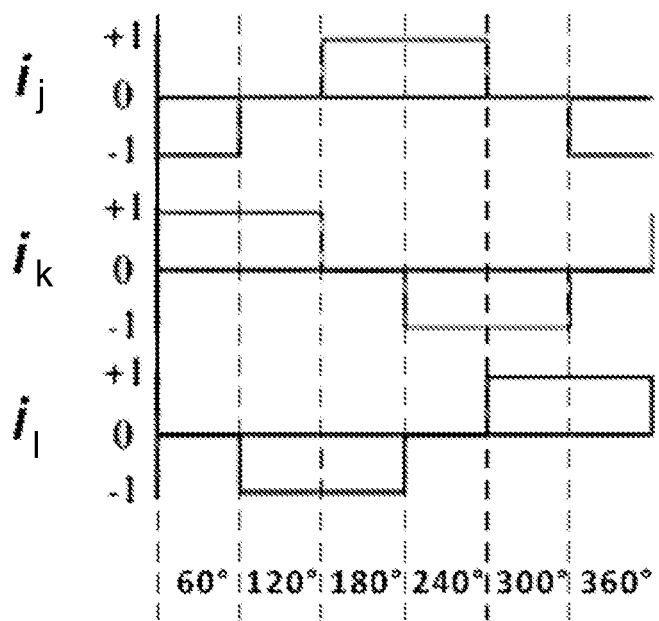
FIG. 2 illustrates commutation transitions within one electrical rotation at the supply terminals of a motor controller.

FIG. 2 shows the six commutation transitions occurring within one electrical rotation in a three-phase brushless DC motor driven in block commutation mode, wherein the commutations each take place at an electrical angular spacing of 60°. It can be seen that the non-driven supply terminal is maintained in one phase only in one commutation interval and after that immediately switches back to the driven state; the phases are labeled here as $i_j$, $i_k$, and $i_l$. "Non-driven" here can mean that the applicable supply terminal of the motor controller is open in terms of potential, which is to say is pulled neither to ground nor to the positive operating voltage $V_{DC}$ by the power switches of the converter 7. A phase or the associated supply terminal 3 is "driven" when the supply terminal is set by the motor controller to a defined electrical potential and is not open in terms of potential, which is to say is not floating. One of the two driven supply terminals 3 of the motor controller 4 switches to the non-driven state, while the other driven supply terminal remains in the driven state. By means of the block-commutated drive, an appropriate rotating field with which a corresponding torque can then be applied is thus created in the brushless DC motor.

EP 2940857 A1 discloses a method and an arrangement with which such motors driven in block commutation mode can be emulated. A goal in the present case is to further develop the method such that it is generally possible to emulate three-phase electric motors, which is to say even those electric motors whose phases are driven continuously by the motor controller, which thus have no floating, currentless phases. Of course, these motors also have zero crossings of current, exactly as is the case with block-commutated motors, but their phases are continuously connected by the motor controller 4 in terms of potential.

Figure 3:
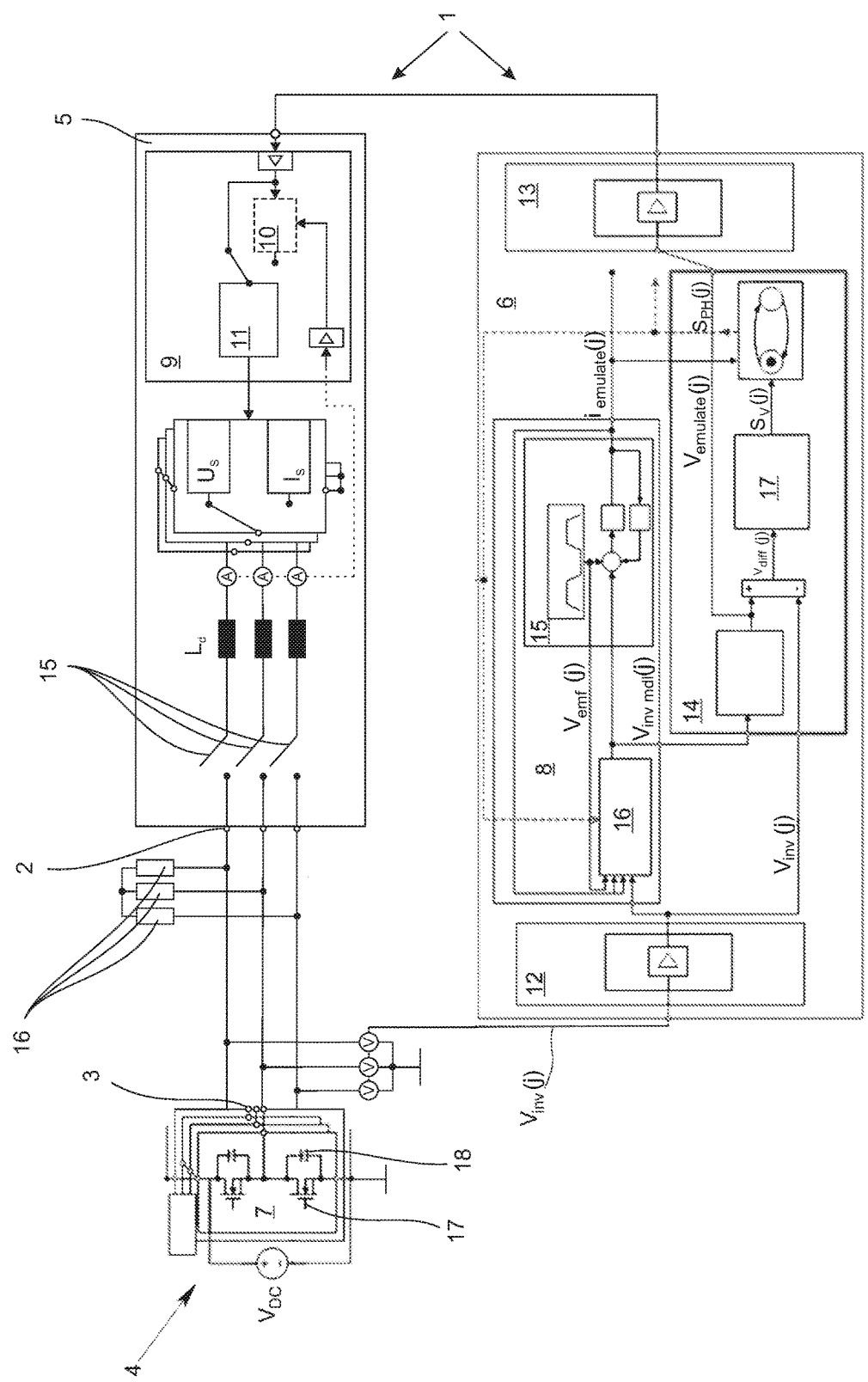
FIG. 3 is a detailed representation of the arrangement for carrying out the method according to an embodiment of the invention.

In FIG. 3, the arrangement from FIG. 1 for carrying out the method according to the invention with the emulator controller 6 configured according to the invention is shown once again, at a higher level of detail. Shown within the emulator power electronics 5 is a controller 9, which ensures that the predefined phase currents are actually set at the load terminals 2 as specified by the emulator controller 6. To this end, the phase current of interest in each case is measured in return within the emulator power electronics 5 and is supplied to a control algorithm 10 for the purpose of producing a control deviation. By means of a modulator 11, a predefined voltage value or a predefined current value is assigned to the correct phase in each case.

The emulator controller 6 in the exemplary embodiment shown is implemented on an FPGA board, on which "hard-wired" circuit structures ensure the ability to execute the method described below especially rapidly. The output voltages $v_{inv}(j)$, which are measured at the supply terminals 3 of the motor controller 4, are read into the emulator controller 6 through the input interface 12 and are made available there; these are therefore actual measured quantities. The calculated target specifications for calculated phase voltages $v_{emulate}(j)$ and for calculated phase currents $i_{emulate}(j)$ are output to the emulator power electronics 5 through the output interface 13.

Additionally implemented within the emulator controller 6 is a state machine 14 that is used to detect commutation-related state changes at the supply terminals 3 of the motor controller 4. The state of the supply terminal j is invariably referred to hereinbelow as $S_{SP}(j)$, where the value 1 stands for the non-driven state of the supply terminal j and the value 0 stands for the driven state of the supply terminal in question. A current can even flow in the case of a non-driven supply terminal, namely through a freewheel diode, until it drops to nothing. In this case, the state is 0. More precise details on the structure and content of the emulator controller 6 are not important here; European published application EP 2940857 A1 contains information in this regard.

The load emulator 1 shown in FIG. 3 additionally includes a switch 15, with which the emulator power electronics 5 can be disconnected with high resistance from the supply terminals 3. It could equally well be said that the emulator power electronics can be disconnected with high resistance from the load terminals 2 using the switch 15, which ultimately also achieves a disconnection of the emulator power electronics 5 from the supply terminals 3. What is important is that the emulator power electronics 5 are no longer effectively connected to the motor controller 4, and cannot electrically act on the motor controller 4. The switch 15 here includes a total of three semiconductor switches, with which each phase can be separately disconnected with high resistance from the load terminals 2—and thus from the supply terminals 3 of the motor controller 4. In the "high-resistance state" of a supply terminal j that can be achieved through the switch 15, $S_{PH}(j)$ assumes the value 2 as a result.

Conversely, the emulator power electronics 5 can of course also be reconnected with low resistance to the supply terminals 3 of the motor controller 4 using the switch 15. The low-resistance connection to the supply terminals 3 of the motor controller 4 is critical here, since it is a matter of the electrically effective coupling of the emulator power electronics 5 to the motor controller 4. Moreover, the load terminals 2 are connected to one another through a high-resistance resistor network 16. This is equivalent to the supply terminals 3 of the motor controller being connected to one another through the high-resistance resistor network 16. As will be made clear below, the important thing is the electrical connection of the supply terminals 3 of the motor controller 4 through the resistor network 16, namely even when the emulator power electronics 5 are disconnected with high resistance by the switch 15 so that an electrically effective connection no longer exists between the motor controller 4 and the emulator power electronics 5.

In order to simulate selected operating states of the electric motor, the emulator power electronics 5 are disconnected with high resistance from the load terminals 2 using the switch 15, or the emulator power electronics 5 that have already been disconnected from the load terminals 2 are connected with low resistance to the load terminals 2 using the switch 15. It could equally well be said that, in order to simulate selected operating states of the electric motor, the emulator power electronics 5 are disconnected with high resistance from the supply terminals 3 using the switch 15, or the emulator power electronics that have already been disconnected with high resistance from the supply terminals 3 are connected with low resistance to the supply terminals 3 using the switch 15. At any event, the result is that the switch 15 does not influence the high-resistance connection of the supply terminals 3 by the high-resistance resistor network 16.

Due to the resistor network that is always effectively connected to the supply terminals 3 of the motor controller 4, it is also possible to respond to those operating modes of the motor controller that lie outside normal operation as a motor or even as a generator, which is to say even when the emulator power electronics 5 are disconnected with high resistance from the motor controller 4. When the motor controller 4 applies a voltage or a voltage pattern to the supply terminals 3 for initialization of an operating phase, these applied voltages can be measured in return through the resistor network 16, for example through different supply terminals 3. Such an application of a test pattern to the supply terminals is frequently used by the motor controller 4 for identifying the external connection of the supply terminals 3.

In the present case, the high-resistance resistor network 16 is a star connection of three essentially ohmic resistors, wherein each of the free ends of the star connection is connected to a different supply terminal 3 of the motor controller 4. The statement that the resistors are essentially ohmic can mean that the elements of the resistor network 16 here are resistors as customarily understood in practical electrical engineering, with the knowledge that ideal ohmic resistors do not exist, which is to say that every electrical component can of course also have parasitic inductive and capacitive characteristics.

Figure 4:
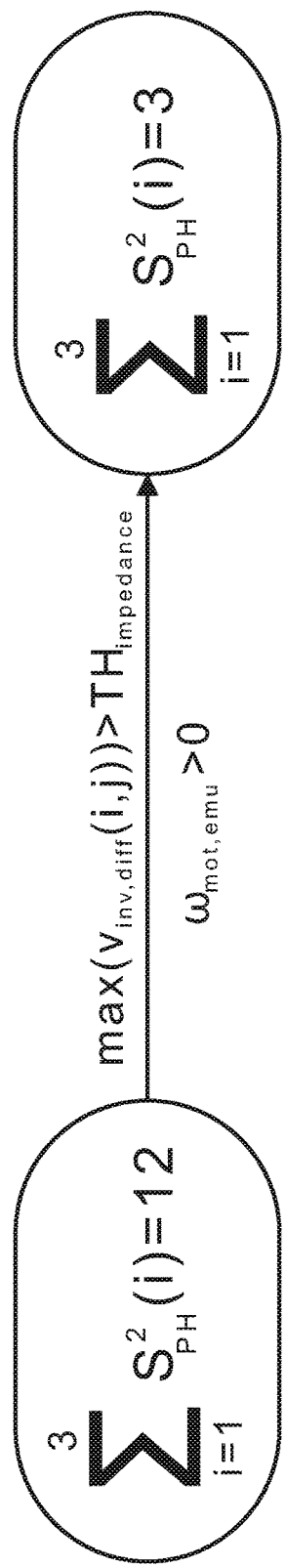
FIG. 4 is a state diagram to explain the detection of the transition of a supply terminal of the motor controller from the high-resistance state into the voltage mode.

In FIG. 4, an exemplary embodiment is shown in which the emulator power electronics 5 are initially disconnected with high resistance from the load terminals 2 of the emulator power electronics 5, and thus also disconnected with high resistance from the supply terminals 3 of the motor controller 4. Thus $S_{PH}(i)=2$ applies for all phases. A motor startup as a motor is detected by a commencing driving of the supply terminals 3 by the motor controller 4 when at least one of the output difference voltages $v_{inv,diff}(i,j)$ determined by measurement between the supply terminals i, j of the motor controller 4 is greater than a predetermined voltage threshold $TH_{imepdance}$. It is clear that difference voltages $v_{inv,diff}(i, j)$ between the supply terminals 3 of the motor controller 4 that can be detected by measurement can indicate a commencing driving of the motor. It is likewise possible to detect startup of the motor as a generator. Once again the initial state is the state in which the motor controller 4 drives no supply terminal 3 and the emulator power electronics 5 are disconnected from the supply terminals 3 of the motor controller or from the load terminals 2 of the emulator power electronics 5 using the switch 15. Motor startup as a generator is detected when the motor speed $\omega_{mot,emu}$ of the motor model 8 is evaluated and the motor speed $\omega_{mot,emu}$ is not equal to zero, which is likewise shown in FIG. 4.

The result of the detected motor startup, whether as a motor or as a generator, is that the emulator power electronics 5 are connected with low resistance to the load terminals 2, and hence to the supply terminals 3, using the switch 15, and the emulator controller 6 drives the load terminals 2 of the emulator power electronics 5 such that a voltage is supplied to the load terminals 2, and thus to the supply terminals 3, and therefore all phases of the emulator power electronics 5 operate in voltage mode. For the voltage that is supplied to the load terminals 2 by the emulator power electronics 5, a test voltage is used that cannot be applied to the load terminals 2 through the supply terminals 3 by the motor controller 4, wherein the test voltage here corresponds to half the DC link voltage $v_{DC\_Link}$ of the motor controller 4. The choice of such a test voltage makes it possible to discover which of the supply terminals 3 are driven by the motor controller 4. When a supply terminal 3 remains open in terms of potential—floating—from the motor controller 4, the test voltage applied on the part of the emulator power electronics 5 can be measured in return by the emulator controller 6. Otherwise the voltage applied by the motor controller 4 would be the dominant voltage and the one measured in return by the emulator controller 6 through the supply terminals 3.

The application of the test voltage to the load terminals 2 takes place over a latency time $t_3$. The driven state $S_{PH}(j)=0$ of a supply terminal j is detected when the magnitude of the difference voltage $v_{diff}(j)$ between the output voltage $v_{inv}(j)$ measured at the supply terminal j of the motor controller 4 and the test voltage applied through the load terminals 2 after the latency time $t_3$ is greater than a predetermined voltage threshold $v_{TH}$. The latency time $t_3$ is designed to be at least as long as the emulator power electronics 5 require in order to reliably set the specified test voltage.

After detecting the driven state $S_{PH}(j)=0$ of the supply terminal j of the motor controller 4, the emulator controller 6 drives the emulator power electronics 5 such that the phase current $i_{emulate}(j)$ calculated by the emulator controller 6 flows through the supply terminal j that is now driven by the motor controller 4. Upon detection of two simultaneously driven supply terminals 3, it can be assumed that the motor controller 4 is driving in block-commutated mode, and upon detection of three simultaneously driven supply terminals 3, it can be assumed that the motor controller 4 is driving in sine-commutated mode.

Figure 5:
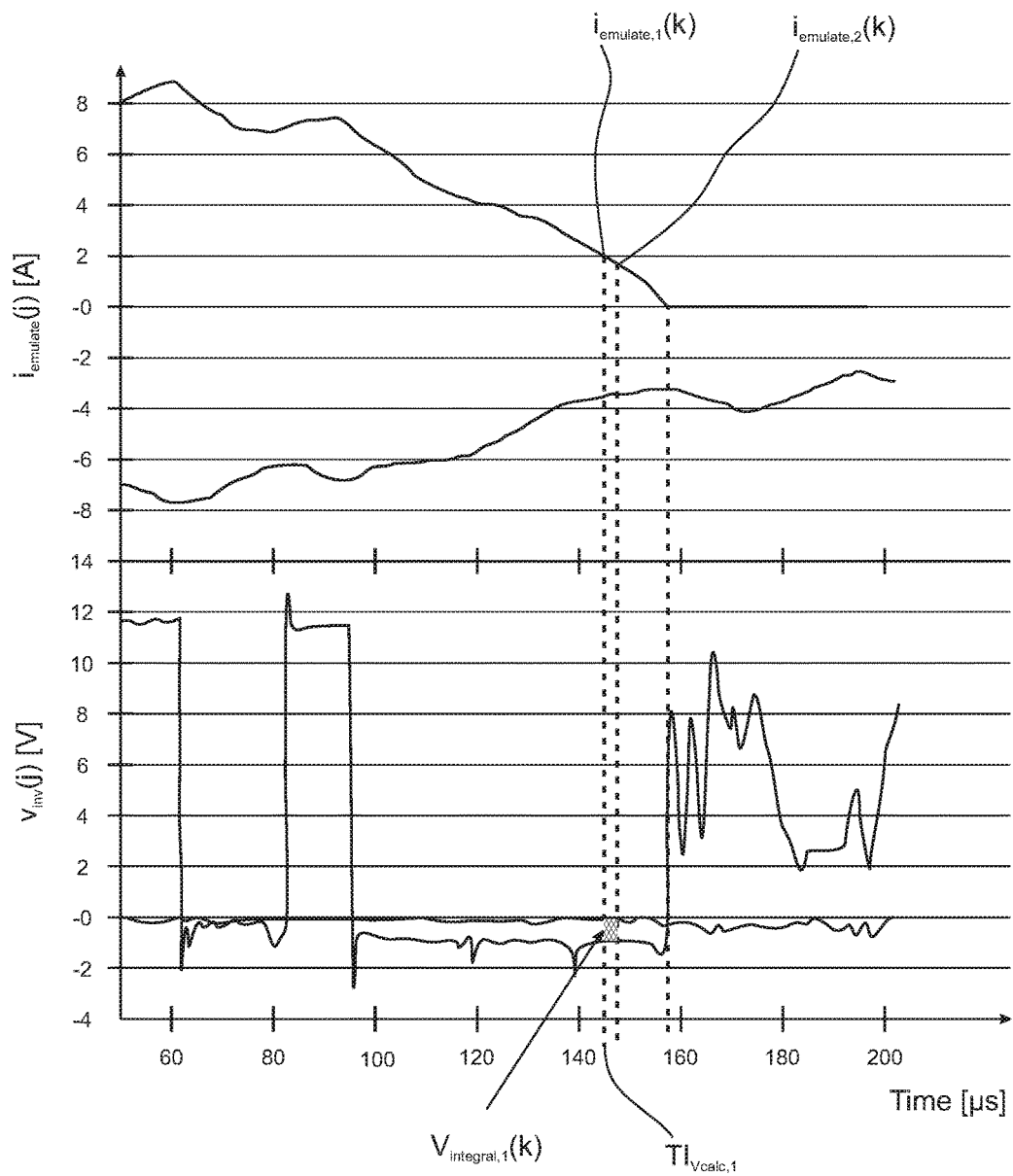
FIG. 5 illustrates curves of measured phase voltages and calculated phase currents for the purpose of detecting the transition of a phase from the driven state to the non-driven state.
Figure 6:
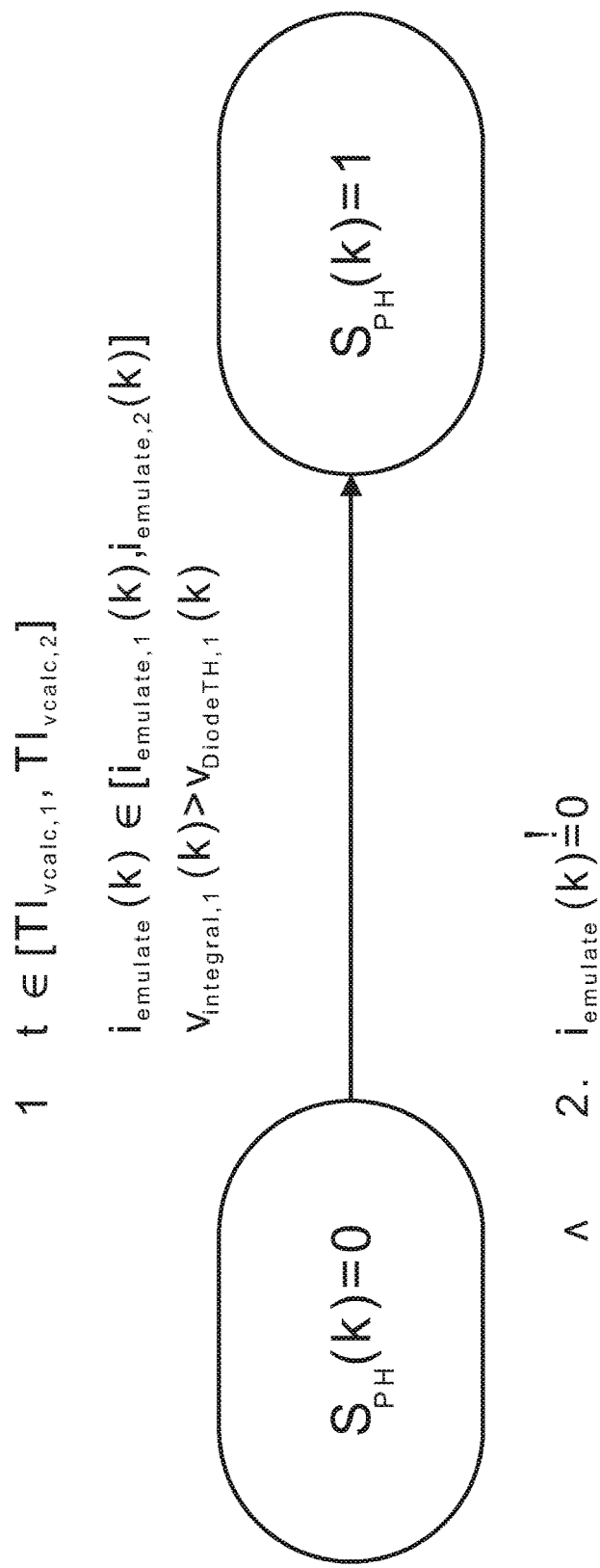
FIG. 6 is a state diagram to explain the method of procedure from FIG. 5.

FIGS. 5 and 6 describe the detection of the transition of a phase from the driven state $S_{PH}(j)=0$ to the non-driven state $S_{PH}(j)=1$. Here, a criterion must be found that permits reliable and unambiguous evaluation of suitable state variables. It does not suffice, for example, simply to monitor only zero crossings of the current in individual phases, since current zero crossings of this nature also occur in sine-commutated motors, which are continuously driven in all phases.

Shown in FIG. 5, first of all, are the curves of two phase voltages and of two phase currents, whereby the curve of the third phase voltage and the curve of the third phase current have been omitted for reasons of clarity. In the lower section of the graph in FIG. 5, the measured curve of the two phase voltages $v_{inv}$ is plotted in volts, and in the upper section of the graph, the corresponding calculated phase currents $i_{emulate}$ are plotted in amperes. The emulator controller 6 has knowledge of both curves: it calculated $i_{emulate}$ itself, and the curve of the phase voltages $v_{inv}$ is present as a measured quantity, see FIG. 3.

The emulator controller 6 detects the transition of a supply terminal k of the motor controller 4 from the driven state $S_{PH}(k)=0$ to the non-driven state $S_{PH}(k)=1$ by monitoring the phase current $i_{emulate}(k)$. The time interval $TI_{Vcalc,\ 1}$, in which the phase current $i_{emulate}(k)$ calculated by the emulator controller 6 decreases from a predetermined first current value $i_{emulate,\ 1}(k)$ to a predetermined second current value $i_{emulate,\ 2}(k)$, is considered. The crossing of these limit values thus defines the time interval $TI_{Vcalc,\ 1}$. In this time interval, the time integral $V_{integral,\ 1}$ is then calculated over the corresponding measured output voltage $v_{inv}(k)$ of the supply terminal k of the motor controller 4. If the time integral $V_{Integral,\ 1}$ is greater than a predetermined voltage-time threshold $V_{DiodeTH,\ 1}(k)$, then the transition of the phase to the non-driven state $S_{PH}(k)=1$ is detected.

This method makes use of the fact that the converter 7 of the motor controller 4 has semiconductor switches 17 with freewheel diodes 18 connected in antiparallel to the direction of operating current (FIG. 3). If a supply terminal 3,k of the motor controller is no longer driven, then the applicable current path is free in terms of potential, wherein the current in the current path k can only decrease steadily because of the motor inductance, and decays through the freewheel diodes 18. During this process, a forward voltage of approximately 0.7 V, which is applied to the applicable supply terminal and is measured, decreases at the freewheel diode concerned. In contrast to this, in the case of a driven supply terminal 3,k with current zero crossing, a defined voltage of 0 V would be present at the applicable supply terminal, since the low-side half-bridge switch 17 established an electrical connection to the ground potential. In the first case, the voltage-time integral in the time interval $TI_{Vcalc,\ 1}$ is not equal to zero, in the second case it is practically equal to zero. Here, the voltage-time threshold $V_{DiodeTH,\ 1}(k)$ has been calculated on the basis of half the freewheel diode voltage of 0.35 V over the time interval through integration.

In the exemplary embodiment shown in FIG. 5, the predetermined first current value $i_{emulate,\ 1}(k)$ is 2 A and thus corresponds to approximately one quarter of the maximum calculated current value of the phase current $i_{emulate}(k)$. The predetermined second current value $i_{emulate,\ 2}(k)$ is 1.75 A in the example, and thus corresponds to approximately three-quarters of the predetermined first current value $i_{emulate,\ 1}(k)$.

In FIG. 6, the detection of the state transition from the driven state $S_{PH}(j)=0$ to the non-driven state $S_{PH}(j)=1$ is formally represented in the form of a state diagram, such as is implemented within the framework of the state machine 14. When the phase current becomes zero and the precondition on the basis of the voltage-time integral is satisfied, the state change takes place.

Figure 7:
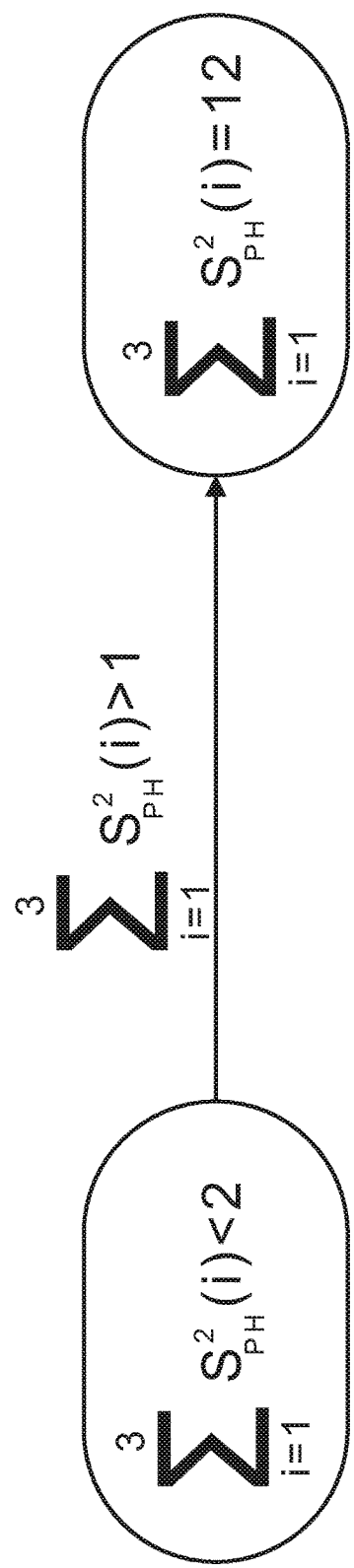
FIG. 7 is a state diagram to explain the transition into the high-resistance state.

Finally, FIG. 7 shows the transition of all phases into the high-resistance state, for which purpose the above-described detection of the non-driven state of a supply terminal 3 or of a phase is used. The emulator controller 6 monitors the transition of all supply terminals of the motor controller 4, and thus also detects a state change from the driven state $S_{PH}(k)=0$ to the non-driven state $S_{PH}(k)=1$. Upon detection of the transition of at least two supply terminals 3 of the motor controller 4 from the driven state $S_{PH}(k)=0$ to the non-driven state $S_{PH}(k)=1$, the emulator power electronics 5 are disconnected with high resistance from the supply terminals 3 using the switch 15. This is accomplished here by disconnection from the load terminals 2, which are always connected to the supply terminals 3. The background of this state change is the knowledge that when there are two non-driven supply terminals 3, no current can flow in the third phase as well, so there is no meaningful operating state here.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for emulating a three-phase electric motor using a load emulator, the load emulator being connected in a three-phase manner via its load terminals to supply terminals of a motor controller, the load emulator having emulator power electronics and an emulator controller for controlling the emulator power electronics, the method comprising:
    determining via the emulator controller the supply terminals that are driven by the motor controller and the supply terminals that are not driven, the emulator power electronics being driven by the emulator controller such that phase currents calculated by the emulator controller on the basis of a motor model flow in the supply terminals that are driven by the motor controller;
    calculating a phase voltage by the emulator controller based on a motor model that is applied to the supply terminal that is not driven by the motor controller;
    providing the load emulator with a switch with which the emulator power electronics are disconnected with high resistance from the supply terminals and with which the emulator power electronics are connected with low resistance to the supply terminals, the supply terminals being connectable to one another through a high-resistance resistor network; and
    disconnecting, in order to simulate selected operating states of the electric motor, the emulator power electronics with high resistance from the supply terminals via the switch or connecting the emulator power electronics that have already been disconnected with high resistance from the supply terminals with low resistance to the supply terminals via the switch.

2. The method according to claim 1, wherein a star connection of three essentially ohmic resistors is selected as the high-resistance resistor network, and wherein each of free ends of the star connection is connected to a different supply terminal of the motor controller.

3. The method according to claim 1, wherein, as an initial state, the motor controller drives no supply terminal and the emulator power electronics are disconnected with high resistance from the supply terminals using the switch, wherein a motor startup of a motor is detected by a commencing driving of the supply terminals by the motor controller when at least one of the output difference voltages determined by measurement between the supply terminals of the motor controller is greater than a predetermined voltage threshold.

4. The method according to claim 1, wherein, as an initial state, the motor controller drives no supply terminal and the emulator power electronics are disconnected with high resistance from the supply terminals using the switch, and wherein a motor startup of a generator is detected when the motor speed of the motor model is evaluated and the motor speed is not equal to zero.

5. The method according to claim 3, wherein, when a motor startup as a motor or as a generator is detected, the emulator power electronics are connected with low resistance to the supply terminals using the switch and the emulator controller drives the load terminals of the emulator power electronics such that a voltage is applied to the load terminals.

6. The method according to claim 5, wherein the emulator controller drives the load terminals of the emulator power electronics such that a test voltage is supplied to the supply terminals that cannot be applied to the supply terminals by the motor controller, or wherein the test voltage corresponds to half the DC link voltage of the motor controller plus a simulated induced back EMFs in a corresponding motor phase.

7. The method according to claim 6, wherein an application of the test voltage to the supply terminals takes place over a latency time and the driven state of a supply terminal is detected when a magnitude of a difference voltage between an output voltage measured at the supply terminal of the motor controller and the test voltage applied through the load terminals is greater after a latency time than a predetermined voltage threshold.

8. The method according to claim 7, wherein the latency time is adapted to be at least as long as the emulator power electronics require in order to reliably set the specified test voltage.

9. The method according to claim 7, wherein, after detecting the driven state of the supply terminal of the motor controller, the emulator controller drives the emulator power electronics such that the phase current calculated by the emulator controller flows through the supply terminal that is now driven by the motor controller, or wherein, upon detection of two simultaneously driven supply terminals, the model of a block-commutated motor is used as the motor model and upon detection of three simultaneously driven supply terminals, the model of a sine-commutated motor is used as the motor model.

10. The method according to claim 1, wherein the emulator controller detects the transition of a supply terminal of the motor controller from the driven state to the non-driven state such that, in a time interval in which the phase current calculated by the emulator controller decreases from a predetermined first current value to a predetermined second current value, the time integral over the corresponding measured output voltage of the supply terminal of the motor controller is calculated, and the time integral is greater than a predetermined voltage-time threshold.

11. The method according to claim 10, wherein the predetermined first current value is less than half a maximum calculated current value of the phase current or is less than a quarter of the maximum calculated current value of the phase current, or wherein the predetermined second current value is a fraction of the predetermined first current value or is three-quarters of the predetermined first current value, or wherein the predetermined voltage-time threshold is a time integral of half a freewheel diode voltage of a freewheel diode included in the motor controller.

12. The method according to claim 10, wherein the emulator controller analyzes the transition of all supply terminals of the motor controller from the driven state to the non-driven state and upon detection of the transition of at least two supply terminals of the motor controller from the driven state to the non-driven state, the emulator power electronics are disconnected with high resistance from the load terminals using the switch.

13. A load emulator for emulating a three-phase electric motor, the load emulator comprising:
  load terminal configured to connect in a three-phase manner to supply terminals of a motor controller, the supply terminals being connected to one another through a high-resistance resistor network;
  emulator power electronics; and
  an emulator controller to control the emulator power electronics, the emulator controller determining which supply terminals are driven by the motor controller and the supply terminals that are not driven; and
  a switch with which the emulator power electronics are disconnected with high resistance from the supply terminals and with which the emulator power electronics are connected with low resistance to the supply terminals,
  wherein the emulator power electronics are driven by the emulator controller such that phase currents calculated by the emulator controller based on a motor model flow in the supply terminals that are driven by the motor controller, and
  wherein a phase voltage calculated by the emulator controller based on the motor model is applied to the supply terminal that is not driven by the motor controller.

14. The load emulator according to claim 13, wherein, in order to simulate selected operating states of the electric motor, the emulator controller drives the emulator power electronics and the switch such that the emulator power electronics are disconnected with high resistance from the supply terminals using the switch or the emulator power electronics that have already been disconnected with high resistance from the supply terminals are connected with low resistance to the supply terminals using the switch.

15. The load emulator according to claim 13, wherein the high-resistance resistor network is a star connection of three essentially ohmic resistors, wherein each of the free ends of the star connection is connected to a different supply terminal of the motor controller.

* * * * *